United States Patent
Bourdet et al.

(10) Patent No.: US 11,321,626 B2
(45) Date of Patent: May 3, 2022

(54) METHOD FOR CONTROLLING A SPIN QUBIT QUANTUM DEVICE

(71) Applicant: COMMISSARIAT A L'ENERGIE ATOMIQUE ET AUX ENERGIES ALTERNATIVES, Paris (FR)

(72) Inventors: Leo Bourdet, Saturargues (FR); Louis Hutin, Saint-Martin-le-Vinoux (FR); Yann-Michel Niquet, Saint Martin le Vinoux (FR); Maud Vinet, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 319 days.

(21) Appl. No.: 16/626,827

(22) PCT Filed: Jun. 27, 2018

(86) PCT No.: PCT/FR2018/051569
§ 371 (c)(1),
(2) Date: Dec. 26, 2019

(87) PCT Pub. No.: WO2019/002761
PCT Pub. Date: Jan. 3, 2019

(65) Prior Publication Data
US 2020/0226486 A1    Jul. 16, 2020

(30) Foreign Application Priority Data

Jun. 28, 2017 (FR) .................................. 1755967
Jan. 31, 2018 (FR) .................................. 1850832

(51) Int. Cl.
*G06N 10/00* (2019.01)
*H01L 29/10* (2006.01)
(Continued)

(52) U.S. Cl.
CPC ......... *G06N 10/00* (2019.01); *H01L 29/1033* (2013.01); *H01L 29/66984* (2013.01); *H01L 29/7613* (2013.01); *B82Y 10/00* (2013.01)

(58) Field of Classification Search
None
See application file for complete search history.

(56) References Cited

U.S. PATENT DOCUMENTS 5,488,030 A * 1/1996 Tanaka ................. H01L 39/225
                                                          257/33
5,854,493 A * 12/1998 Nakamura ............ H01L 39/146
                                                          257/39
(Continued)

FOREIGN PATENT DOCUMENTS

| EP | 2 736 080 A1 | 5/2014 |
| EP | 3 082 073 A1 | 10/2016 |
| WO | WO 2014/146162 A1 | 9/2014 |

OTHER PUBLICATIONS

U.S. Appl. No. 15/967,778, filed May 1, 2018, US 2018-0331108 A1, Louis Hutin, et al.

(Continued)

*Primary Examiner* — Khaja Ahmad
(74) *Attorney, Agent, or Firm* — Oblon, McClelland, Maier & Neustadt, L.L.P.

(57) ABSTRACT

A method is described for controlling a spin qubit quantum device that includes a semiconducting portion, a dielectric layer covered by the semiconducting portion, a front gate partially covering an upper edge of the semiconducting portion, and a back gate. The method includes, during a manipulation of a spin state, the exposure of the device to a magnetic field B of value such that $g \cdot \mu_B \cdot B > \min(\Delta(Vbg))$. The method also includes the application, on the rear gate, of an electrical potential Vbg of value such that $\Delta(Vbg) < g \cdot \mu_B \cdot B + 2|M_{SO}|$, and the application, on the front gate, of a (Continued)

confinement potential and an RF electrical signal triggering a change of spin state, with g corresponding to the Landé factor, $\mu_B$ corresponding to a Bohr magneton, $\Delta$ corresponding to an intervalley energy difference in the semiconducting portion, and $M_{SO}$ corresponding to the intervalley spin-orbit coupling.

12 Claims, 6 Drawing Sheets

(51) Int. Cl.
    *H01L 29/66*     (2006.01)
    *H01L 29/76*     (2006.01)
    *B82Y 10/00*     (2011.01)

(56) References Cited

U.S. PATENT DOCUMENTS

| | | | |
|---|---|---|---|
| 2014/0166985 A1 | 6/2014 | Kohda et al. | |
| 2016/0275410 A1 | 9/2016 | Rogge et al. | |
| 2016/0300155 A1 | 10/2016 | Betz et al. | |
| 2018/0358538 A1* | 12/2018 | Brink | H01L 39/223 |
| 2019/0164959 A1* | 5/2019 | Thomas | H01L 27/0617 |

OTHER PUBLICATIONS

U.S. Appl. No. 16/159,923, filed Oct. 15, 2018, US 2019-0123183 A1, Louis Hutin, et al.
U.S. Appl. No. 16/284,103, filed Feb. 25, 2019, US 2019-0266509 A1, Louis Hutin, et al.
U.S. Appl. No. 16/196,390, filed Nov. 20, 2018, US 2019-0157300 A1, Francois Andrieu, et al.
U.S. Appl. No. 16/422,391, filed May 24, 2019, US 2019-0371671 A1, Claire Fenouillet-Beranger, et al.
U.S. Appl. No. 16/525,043, filed Jul. 29, 2019, Perrine Batude, et al.
International Search Report dated Aug. 30, 2018 in PCT/FR2018/051569 filed Jun. 27, 2018; citing documents AA-AC, AO-AQ, and AX-AY therein, 3 pages.
Preliminary French Search Report dated May 14, 2018 in French Patent Application No. 1755967; citing documents AO-AQ and AX-AY therein, 2 pages (with English Translation of Categories of Cited Documents).
Preliminary French Search Report dated Jun. 14, 2018 in French Patent Application No. 1850832, citing documents AO-AQ and AX-AY therein, 2 pages (with English Translation of Categories of Cited Documents).
Baugh et al., "Building a spin quantum bit register using semiconductor nanowires," Nanotechnology, vol. 21, No. 13. 2010, pp. 1-6, XP020174730.
Morton et al., "Embracing the quantum limit in silicon computing," Nature, vol. 479; Nov. 2011, pp. 345-353, XP055474462.
Huang et al., "Electrically driven spin qubit based on valley mixing." Physical Review B, vol. 95, No. 7, 2017, pp. 075403-1-075403-8.

* cited by examiner

METHOD FOR CONTROLLING A SPIN QUBIT QUANTUM DEVICE

TECHNICAL FIELD AND PRIOR ART

The invention relates to the field of spintronics, and in particular quantum information processing, or quantum computing. The invention is concerned in particular with a method for controlling a quantum device with quantum bits or spin qubits, enabling the spin of an electric charge in a semiconductor to be controlled in electric field.

The conduction band of some semiconductors, including silicon, has excellent properties, in terms of coherence, to make spin qubits. Making a spin qubit implies to be able to locally manipulate the spin of the electric charge, that is control the switching between "spin up" and "spin down" states representing the two eigen states of the qubit.

A first possibility to make this manipulation consists in using a locally controlled magnetic field to which the qubit is exposed. This first approach is based on the property of some electrons to absorb and then emit again the energy of an electromagnetic radiation when placed in a magnetic field, called Electron Paramagnetic Resonance (EPR) or Electron Spin Resonance (ESR). Such a local control of the magnetic field is however difficult to implement.

A second possibility to locally manipulate the spin of an electric charge consists in using a locally controlled electric field to which the qubit is exposed. This approach, called EDSR for "Electric Dipole Spin Resonance", involves an electronic dipole which, to be coupled to the spin, either requires the presence of an inhomogeneous magnetic field (which inhomogeneity is achieved for example with integrated micro-magnets), or makes use of the spin-orbit coupling in the qubit.

The energy associated with a state in which the spin of a qubit is depends in particular on the valley of the conduction band in which the electric charge whose spin is manipulated is located. For example, the conduction band of silicon includes three groups of two valleys. It is possible to separate a group of two valleys v1 and v2 from the others by confining the electron in a potential well induced for example by a strong electric field, and to choose that the two possible states of a qubit correspond to the energy levels of the electric charge in the "spin up" and "spin down" state in the lowest energy valley (v1).

FIG. 1 shows the energy level (in µeV) of an electron in silicon, in both lowest energy valleys v1 and v2, as a function of the value of the magnetic field B (in T) to which the qubit is subjected. Reference 10 designates the energy level of an electron in the "spin down" state in the valley v1, noted v1↓, reference 12 designates this energy level in the valley v1 in the "spin up" state, noted v1↑, reference 14 designates this energy level in the valley v2 in the "spin down" state, noted v2↓, and reference 16 designates this energy level in the valley v2 in the "spin up" state, noted v2↑.

The inter-valley spin-orbit coupling, also called SOiv, enables the spin and the valley to be rotated together, and can be exploited to manipulate the spin through EDSR. The SOiv intensity depends on the nature of the material used and is characterised by the matrix element $M_{SO}=<v1\uparrow|H_{so}|v2\downarrow>$ of the spin-orbit coupling Hamiltonian $H_{so}$ between the states v1↑ and v2↓. In silicon, $M_{SO}$ is naturally low (a few µeV to about ten µeV). However, its effects are exacerbated when the energy separating state v1↑ from state v2↓ is small. EDSR (transition between v1↓ and v1↑) thereby results from a coupling v1↓-v2↓ by the electric field and a coupling v2↑-v1↓ by the SOiv.

The manipulation of the spin state by EDSR is extremely dependant on the valley-orbit splitting, noted Δ and which is representative, in the example of FIG. 1, of the deviation between the energy levels v1↑ and v2↑. In FIG. 1, the deviation between the energy levels v1↑ and v2↓, is equal to $\Delta-g\cdot\mu_B\cdot B$, with g corresponding to the Lande factor, $\mu_B$ the Bohr magneton, and B the magnetic field to which the qubit is exposed. Reference 18 noted in FIG. 1 designates a resonance region in which the energy levels of the states v1↑ and v2↓ are close to each other. Beyond this resonance region 18 (which corresponds to the part where the magnetic field B is higher than about 1.2 T in FIG. 1), reference 12 designates the energy level of the state v2↓ and reference 14 designates the energy level of the state v1↑.

It is thus interesting to have a qubit structure enabling the SOiv effects to be increased.

Document "Electrically driven spin qubit based on valley mixing" by W. Huang et al., Physical Review B 95, 075403 (2017), describes a qubit structure in which, in order to have a significant SOiv, a silicon layer is modified in order to form a step of a few (1 to 5) atomic layers. The SOiv effects are exacerbated when the electron wave function is positioned at this step. This structure makes use of the SOiv between the states v1↑, v1↓ and excited states of the valley v2 which are not shown in FIG. 1.

A first problem with such a structure is that the position, height and morphology of a step is very difficult to control (a height variation of an atomic layer, that is about 0.2 nm, substantially modifying the qubit properties). Further, although the Rabi frequency (speed rotation of the spins) increases with the step height, it becomes increasingly difficult for the electron to cross this step. This results in an electrical control loss (instability) for steps higher than 4-5 atomic layers (0.8 to 1 nm).

The Rabi frequency obtained for such a structure comprising a step the thickness of which is the order of 1 to 4 atomic layers, that is about 0.2 to 0.8 nm, is in the order of 2 to 3 MHz. A higher Rabi frequency can be obtained by increasing the step height, for example about 10 MHz or more for a step with a thickness equal to 1 nm or more, but at the expense of the stability of the spin state.

DISCLOSURE OF THE INVENTION

One purpose of the present invention is to provide a method for controlling a quantum device with one or more spin qubits, in which the SOiv effects are individually controlled for the or each qubit of the device without having to modify the value of the magnetic field to which the qubit(s) is (are) exposed and the value of which can be significant, and enabling spin state stability problems encountered with the structures of prior art to be solved. Another purpose of the present invention is to provide a dimensioning of the device relative to the properties of the materials, symmetries of the structure and electrical control signals enabling the spin to be efficiently manipulated while ensuring its stability apart from the manipulation operations.

To that end, the present invention provides a method for controlling a spin qubit quantum device, wherein said quantum device includes at least:

- a semiconductor portion comprising an upper face, a lower face and side faces substantially perpendicular to the upper and lower faces;

a dielectric layer on which the semiconductor portion is disposed such that the lower face of the semiconductor portion is disposed on the side of the dielectric layer;

a front gate partially covering at least one upper ridge of the semiconductor portion formed at a junction between the upper face and a first of the side faces;

a rear gate such that the dielectric layer is disposed between the rear gate and the semiconductor portion;

the method comprising, upon manipulating, or changing, a spin state of the qubit of the quantum device:

exposing the quantum device to a magnetic field B, and applying, to the rear gate, an electric potential Vbg having a value such that $\Delta(Vbg) < g \cdot \mu_B \cdot B + 2|M_{SO}|$, and applying, to the front gate, an electric potential Vfg confining at least one electric charge under the upper ridge and an electric RF signal triggering a change in spin state of the qubit of the quantum device, with g corresponding to the Lande factor, $\mu_B$ corresponding to the Bohr magneton, $\Delta$ corresponding to the valley-orbit splitting in the semiconductor portion, and $M_{SO}$ the inter-valley spin-orbit coupling, or $SO_{iv}$ coupling, of the quantum device.

This method involves a quantum device comprising a front gate and a rear gate. The use of two gates enables the confinement by the electric field and the valley-orbit splitting $\Delta$ to be separately controlled. More precisely, the electric potential Vfg applied to the front gate can essentially control the confinement of the electric charge the spin of which is manipulated in the device. The electric potential Vbg applied to the rear gate enables $\Delta$ to be adjusted without the risk that the electron leaves the device, if necessary by acting on the front gate too to correct the confinement. Indeed, if only the front gate is used to control $\Delta$, the latter cannot be adjusted without running the risk of deconfining and losing the electric charge. The use of the rear gate enables confinement and $\Delta$ adjustment to be decoupled.

It is possible to act both on Vfg and Vbg to reach the resonance or even to exceed resonance, without deconfining the electric charge the spin of which is manipulated. The action of the rear gate generated by the application of Vbg can thus (but not necessarily) be accompanied with a correction generated by the application of Vfg to the front gate.

In this quantum device, a significant and well-controlled SOiv $M_{SO}$ coupling is achieved because thanks to the signals applied to the front gate and the rear gate upon manipulating the spin state, the wave function of the electric charge the spin of which is manipulated is located in the proximity of the upper ridge of the semiconductor portion which is covered with the front gate. The intersection of the two perpendicular faces forming the upper ridge covered with the front gate exacerbates the contribution of the interfaces to the SOiv, and suppresses the limits imposed by the symmetries to SOiv (the less the structure is symmetrical, the more the SOiv effects are potentially significant).

The manipulation of the state of the electric charge corresponds to a spin state change of the electric charge (switching from the "spin up" state to the "spin down" state or reversely) and to a change of the valley of the conduction band in which the electric charge whose spin is manipulated is located. Turning back to FIG. 1 previously described, if the values of the voltage Vbg and the magnetic field B are such that the manipulation occurs on the left of the resonance region 18, this manipulation essentially relates to the qubit spin, the quantum information corresponding to the "spin up" or "spin down" state of the spin of the charge in a same valley, for example the states v1↑ and v1↓, which correspond to both states of the quantum information. Such a qubit being in a so-called spin qubit regime is difficult to manipulate by EDSR but it is robust towards decoherence (quantum information loss). If the values of the voltage Vbg and of the magnetic field B are such that the manipulation occurs on the right of the resonance region 18, this manipulation essentially relates to the valley of the conduction band of the electric charge: it can be said in this case that the qubit is in a so-called valley qubit regime, in which the quantum information is encoded depending on the valley in which the charge is, for example the states v1↓ and v2↓, which correspond in this case to both states of the quantum information. Such a qubit being in a valley qubit regime is easier to manipulate by EDSR than a qubit being in a spin qubit regime, but the coherence duration of such a qubit in the valley qubit regime is substantially shorter than that of a qubit being in a spin qubit regime.

This quantum device provides a qubit structure enabling the SOiv effects to be increased in order to be able to readily switch over from the spin qubit regime to the valley qubit regime to manipulate the spin. The higher the SOiv, the more an adiabatic change of the qubit regime can be quickly performed.

During the method, the quantum device may be exposed to a magnetic field B having a value such that $g \cdot \mu_B \cdot B > \min(\Delta(Vbg)) - 2|M_{SO}|$, which enables to ensure that the electrical manipulation condition $\Delta(Vbg) < g \cdot \mu_B \cdot B + 2|M_{SO}|$ can be reached. The manipulation of the qubit spin state thus occurs by applying to the rear gate an electric potential Vbg having a value such that $\Delta(Vbg) < g \cdot \mu_B \cdot B + 2|M_{SO}|$ (electric manipulation condition), and to the front gate, an RF electric signal triggering the spin state change. These conditions can be individually met for the or each spin qubit, regardless of the value of the magnetic field B to which the quantum device is subjected.

The manipulation of the qubit spin state may be made at the resonance region by applying, to the rear gate, an electric potential Vbg having a value such that $|\Delta(Vbg) - g \cdot \mu_B \cdot B| \leq 2|M_{SO}|$ (that is $g \cdot \mu_B \cdot B - 2|M_{SO}| \leq \Delta(Vbg) \leq g \cdot \mu_B \cdot B + 2|M_{SO}|$).

The full width at half maximum of the resonance in magnetic field which separates the spin qubit/valley qubit regimes is about $4|M_{SO}|$. Therefore, at least 33% of the maximum Rabi frequency can be reached (which is defined by going deeply in the valley qubit regime with $\Delta(Vbg) < g \cdot \mu_B \cdot B - 10|M_{SO}|$) as soon as $\Delta(Vbg) < g \cdot \mu_B \cdot B + 2|M_{SO}|$.

It is also possible to have the magnetic field B such that $g \cdot \mu_B \cdot B > \min(\Delta(Vbg))$.

In addition, at the end of this manipulation phase, for example during the phases of initialising and reading the qubit(s), the Vbg value may be modified in order not to fulfil the condition $\Delta(Vbg) < g \cdot \mu_B \cdot B + 2|M_{SO}|$ anymore which is not favourable to the spin state stability, without having to modify the value of the magnetic field B to which the quantum device is subjected. The method thus enables spin manipulation to be decoupled from its initialisation and reading.

In addition, the structure of the quantum device does not include the limitations imposed in prior art (when a step is used to locate the wave function), that is a limited Rabi frequency.

In the entire present application, the term a «covers» N is used between two elements to designate the fact that both elements are disposed one against the other, either directly (that is without a further element between them) or indirectly (with one or more further elements interposed between them).

By considering for example that the semiconductor portion is formed by an upper part and a lower part separated from each other by a first plane parallel to the upper and lower faces and passing through the centre of the semiconductor portion, and by two side parts separated from each other by a second plane also passing through the centre of the semiconductor portion and parallel to the side face forming the ridge covered with the front gate, the wave function of the electric charge the spin of which is manipulated can be located, upon manipulating the spin state, in the upper part and in the side part which includes the upper ridge covered with the front gate, that is in the proximity of this upper ridge, under the part of the semiconductor portion covered with the front gate.

The method may further include, during a phase of initialising or reading the qubit, applying the electric potential Vbg having a value such that $\Delta(Vbg) > g \cdot \mu_B \cdot B + 10|M_{SO}|$. In this case, the energy of the electric charge is such that it is far from the resonance region, thus improving the stability of the spin state of this charge upon initialising or reading the qubit.

It is also possible to, during a phase of initialising or reading the qubit, apply an electric potential Vbg having a value such that $|\Delta(Vbg) - g \cdot \mu_B \cdot B| \leq 10|M_{SO}|$.

The semiconductor portion and/or the front gate may be dissymmetrical relative to a plane passing through the centre of the semiconductor portion and parallel to at least one second of the side faces of the semiconductor portion. In this configuration, the front gate and the semiconductor portion form a dissymmetric assembly contributing to achieving an important SOiv. Upon manipulating the spin state, the electric charge the spin of which is manipulated is located in the proximity of the ridge of the semiconductor portion covered with the front gate, via the application of electric potentials to the front and rear gates.

The first and second side faces of the semiconductor portion may correspond to the same side face of the semiconductor portion. In this case, the dissymmetry is in particular due to the front gate which covers this side face and the part of the upper face forming, with this side face, the upper ridge covered with the front gate.

The front gate may cover a single upper ridge of the semiconductor portion. In this case, a significant SOiv is achieved upon manipulating the spin state by locating the electric charge the spin of which is manipulated in the proximity of this upper ridge, and not in a centre upper part of the semiconductor portion.

The front gate may include two distinct parts each covering a single upper ridge of the semiconductor portion formed at a junction of the upper face and one of the side faces of the semiconductor portion, both upper ridges covered with both distinct parts of the front gate being substantially parallel to each other. Both parts of the front gate are said to be distinct because they are not in electrical contact with each other. With such a structure, it is for example possible to locate an electron under each gate (in the proximity of the ridge covered by said gate), in order to make two coupled qubits, either to implement a two-qubit gate, or to read one of the two qubits (the state of which is unknown) by coupling it with the other (prepared in a known state).

The quantum device may further include at least two side gates covering second parts of the semiconductor portion which are located on either side of a first part of the semiconductor portion defining the qubit, and, upon manipulating the spin state of the qubit of the quantum device, electric potentials having values different from each other may be applied to the side gates. Such side gates form barriers that can be used to insulate the qubit when the quantum device is a multiple-quantum well structure. Moreover, by applying electric potentials having different values on these side gates, a dissymmetry is generated within the semiconductor portion, thus increasing the SOiv obtained.

In one embodiment offering more compactness, the quantum device may further include at least two distinct electrically conducting spacers (not electrically connected to each other) and disposed against two opposite sides of the front gate and, upon manipulating the qubit spin state of the quantum device, electric potentials having values different from each other may be applied on both electrically conducting spacers. Such spacers form in this case barriers promoting isolation of the qubit in the semiconductor portion.

The semiconductor portion may include four ends connected to a centre part and each covered at least partially with a part of the front gate which is distinct from the other parts of the front gate, and wherein, upon manipulating the spin state of the qubit of the quantum device, the RF signal may be applied to two neighbouring parts of the front gate. In such a configuration, upon manipulating the spin state, the wave function of the electric charge can thereby be located in the proximity of an upper ridge of the semiconductor portion, in a part being between both ends covered by the parts of the front gate on which the RF signal is applied.

The quantum device may include several spin qubits formed in several distinct semiconductor portions, wherein the rear gate may be coupled to all the distinct semiconductor portions. In this case, the rear gate is common to all the qubits, and, upon manipulating the qubit spin state, the $\Delta$ value is controlled especially through the front gate of each of the qubits.

Alternatively, the quantum device may include several spin qubits formed in several distinct semiconductor portions, and may include several rear gates each coupled with one of the semiconductor portions. In this case, the rear gates are local and each of them can be used to make an individual adjustment to the $\Delta$ value of the qubit to which it belongs.

BRIEF DESCRIPTION OF THE DRAWINGS

The present invention will be better understood upon reading the description of exemplary embodiments given by way of purely indicating and in no way limiting purpose in reference to the appended drawings in which.

Identical, similar or equivalent parts of the different figures described hereinafter bear the same reference numerals so as to facilitate switching from one figure to the other.

The different parts shown in the figures are not necessarily drawn to a uniform scale, to make the figures more readable.

The different possibilities (alternatives and embodiments) should be understood as being non-exclusive to each other and can be combined to each other.

DETAILED DISCLOSURE OF PARTICULAR EMBODIMENTS

Figure 2:
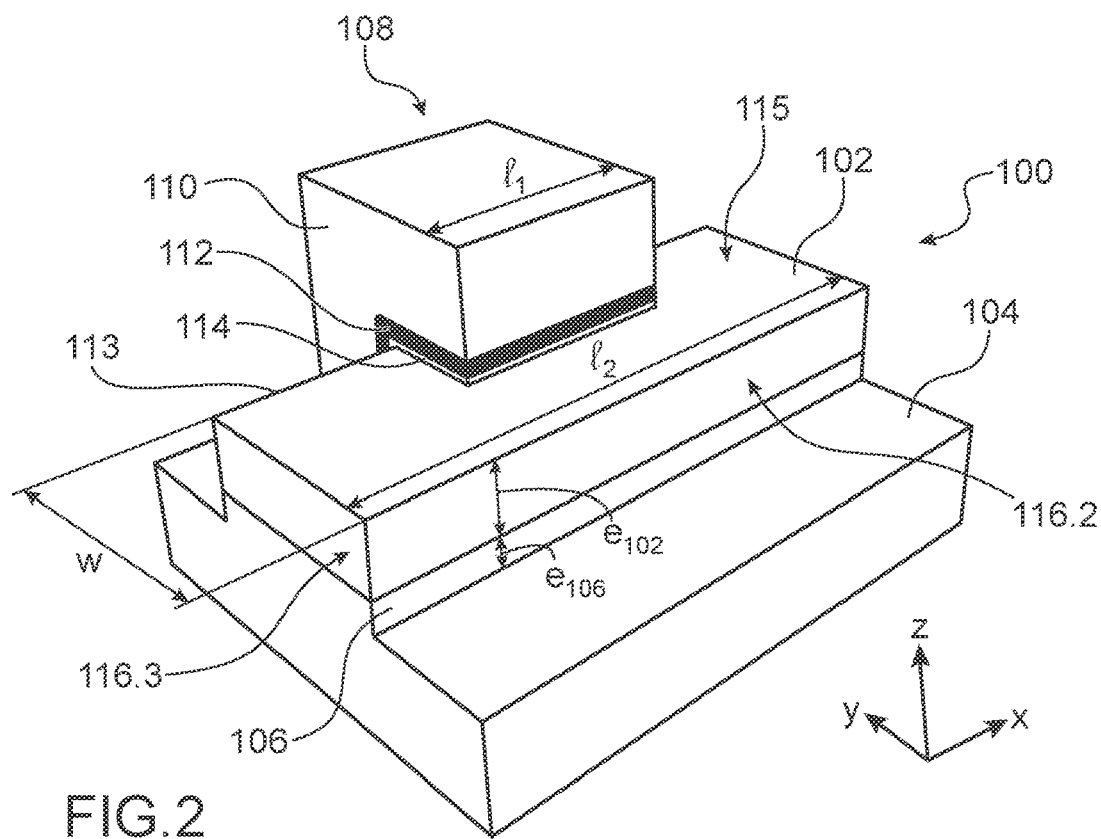
FIGS. 2 to 4 show different schematic views of a quantum device with a spin qubit controlled by the method according to the invention, according to a first embodiment.
Figure 3:
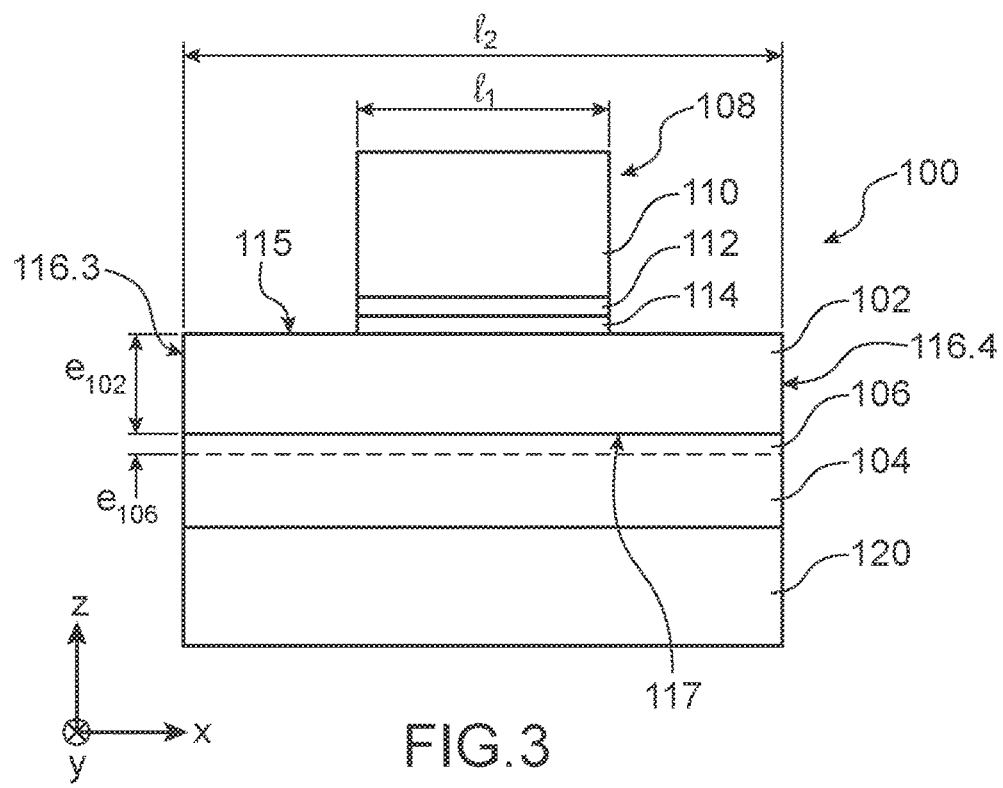
Figure 4:
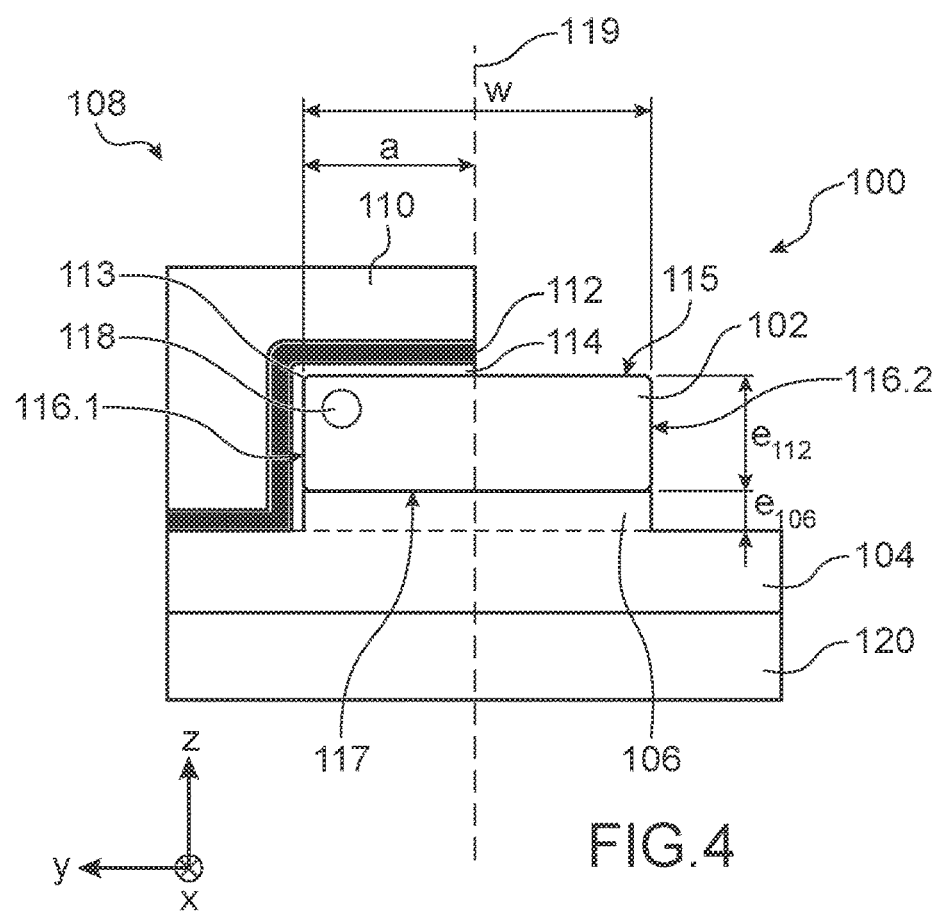

FIGS. 2 to 4 are first referred to, which correspond to different views of a quantum device 100 according to a first embodiment. In these figures, only part of the device 100 forming a single spin qubit is shown, although the device 100 advantageously includes several spin qubits formed next to each other on a same substrate, for example disposed by forming a matrix of spin qubits.

The device 100 includes a semiconductor portion 102, here corresponding to a silicon nanowire. The length l2 of the portion 102, which corresponds to its dimension along the axis X in FIGS. 2 to 4, is typically between about 15 and 100 nm, its width w, which corresponds to its dimension along the axis Y, is for example advantageously between about 15 and 100 nm (but can be arbitrarily large), and its thickness $e_{102}$, which corresponds to its dimension along the axis Z, may be between about 4 and 40 nm.

Further, in this first embodiment, the portion 102 has a substantially parallelepiped rectangle shape and includes an upper face 115, a lower face 117 and four side faces 116 (referenced 116.1 to 116.4 in FIGS. 2 to 4) which are substantially perpendicular to the upper and lower faces 115, 117. Other shapes for the semiconductor portion 102 are however contemplatable.

In the device 100, the portion 102 is intended to form a quantum dot corresponding to a spin qubit.

The portion 102 is disposed on a dielectric layer 104 comprising for example SiO$_2$. The lower face 117 of the portion 102 bears against an upper part 106 of the layer 104 which has a thickness $e_{106}$ for example between about 0 nm (this upper part 106 may not be present) and 10 nm, and which is etched according to the pattern formed by the portion 102 in the plane (X,Y) which is parallel to the upper and lower faces 115, 117.

The portion 102 is partially covered with a front gate 108. This front gate 108 is formed by a first electrically conducting portion 110 and a first dielectric portion 112 disposed between the first electrically conducting portion 110 and the portion 102. Optionally, a second dielectric portion 114 may be disposed between the first dielectric portion 112 and the portion 102, as is the case in FIGS. 2 to 4.

In this first embodiment, the front gate 108 covers a part of a single of the side faces 116 of the portion 102. In FIGS. 2 to 4, the side faces 116 of the portion 102, referenced 116.1 to 116.4, correspond to four faces substantially parallel to the planes (X, Z) and (Y, Z). In these figures, the front gate 108 covers a part of the side face referenced 116.1 but does not cover the side faces referenced 116.2, 116.3 and 116.4. In addition, the front gate 108 covers a part of the upper face 115 of the portion 102.

In FIGS. 2 to 4, the dimension "a" represents the part of the width of the portion 102 covered with the front gate 108, the value of the ratio a/w being included in the interval ]0; 1[.

The device 100 also includes a rear gate 120, visible in FIGS. 3 and 4, enabling the position of the wave function of the qubit to be electrostatically controlled and thus the Δ and $M_{SO}$ values to be modified upon manipulating the qubit spin state. This rear gate 120 enables the vertical electric field produced in the portion 102 to be adjusted.

The length l1 of the front gate 108 is lower than the length l2 of the portion 102 in order to form a quantum dot in the part of the nanowire 102 covered with the gate 108.

By thus covering a single side face 116.1 and a part of the upper face 115 of the portion 102, the front gate 108 partially covers (because l1<l2) a single upper ridge 113 of the portion 102 formed at the junction of the upper face 115 and the side face 116.1 of the portion 102. This particular configuration of the front gate 108 introduces a dissymmetry in the structure of the device 100, by considering both parts of the device 100 located on each side of a plane parallel to the plane (X, Z) and passing through the middle of the portion 102, both parts being different from each other. In FIG. 4, this plane parallel to the plane (X,Z) and passing through the middle of the nanowire 102 is symbolically represented by a dotted line designated by reference 119.

Although they are not shown, the device 100 may include means able to generate the homogeneous magnetic field B to which the portion 102 is exposed upon using the device 100. The value of the magnetic field B may be between about 200 mT and 2 T.

Thanks to the dissymmetric structure of the front gate 108, the electric potential applied to the rear gate 120 and that applied to the front gate 108 upon manipulating the qubit spin state enable an electric charge to be confined in a region of the portion 102 close to the upper ridge 113 of the portion 102 and covered with the front gate 108 and thus the wave function of this charge to be located in the proximity of this upper ridge 113. The region of the portion 102 in which the wave function of the electric charge the spin of which is manipulated is located is symbolically shown in dotted line in FIG. 4 and is designated by reference 118.

By considering that the semiconductor portion 102 is formed with an upper part and a lower part spaced from each other by a first plane parallel to the upper and lower faces 115, 117 and passing through the centre of the portion 102, and with two side parts separated from each other by a second plane also passing through the centre of the portion 102 and parallel to the side face 116.1 forming the ridge 113 covered with the front gate 108, the wave function of the electric charge the spin of which is manipulated is located, upon manipulating the spin state, in the upper part and in the side part which includes the upper ridge 113, that is in the proximity of this upper ridge 113, under the part of the portion 102 covered with the front gate 108.

Figure 1:
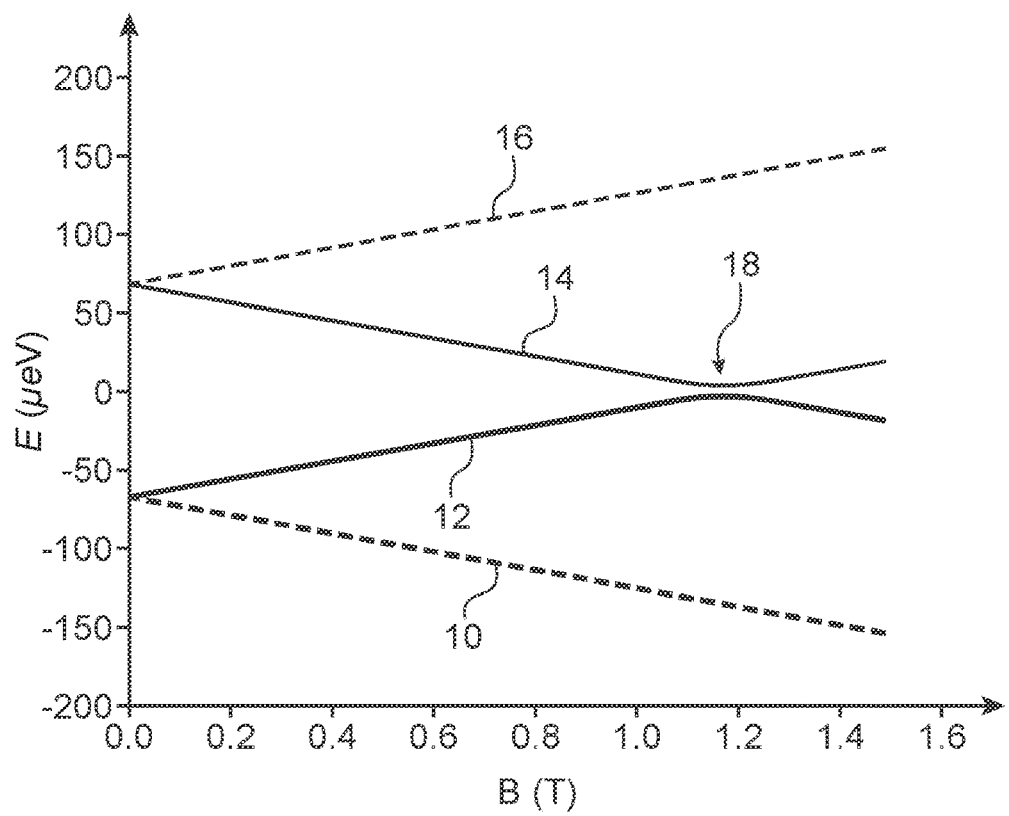
FIG. 1 shows the energy levels of an electron in different valleys, in silicon.

The confinement at the intersection of the faces 115 and 116.1 exacerbates the SOiv by boosting the surface contribution and by suppressing the limitations imposed by the symmetries (confinement in a structure with a symmetry as low as possible). By adjusting both potentials of the front (Vfg) and rear (Vbg) gates, it is further possible to control the electric field in the structure and to properly control the position of the charge within the portion 102, in particular to properly control the distance of this charge with respect to the interfaces between the portion 102 and the dielectric layers 104 and 106. But, the value of the valley-orbit splitting $\Delta$ is particularly dependent on the proximity of the electric charge with these interfaces. The value of the electric potential Vbg applied to the rear gate 120 can thus be adjusted such that the energy of this charge is close to or beyond the point of the resonance region (region 18 in the FIG. 1) where the levels v1↑ and v2↓ cross each other, that is fulfils the condition $\Delta(Vbg) < g \cdot \mu_B \cdot B + 2|M_{SO}|$ (or $|\Delta(Vbg) - g \cdot \mu_B \cdot B| \leq 2|M_{SO}|$ to remain close to the resonance region).

Switching from state v1↓ to state v2Θ can thus be quickly achieved via the application of an RF signal to the front gate 108, and then from state v2↓ to state v1↑ thanks to of the spin-orbit coupling by adjusting Vbg so as to come back adiabatically in the spin qubit regime with $\Delta(Vbg) > g \cdot \mu_B \cdot B + 2|M_{SO}|$. A sharp rotation from state v1↓ to state v1↑ is made, which is characteristic of EDSR.

Thus, by controlling the $\Delta$ value, it is for example possible, during a phase of manipulating the spin state (switching from one to the other of states v1↑ and v1↓), to apply to the rear gate 120 and to the front gate 108 potentials enabling the qubit to fulfil the condition $\Delta(Vbg) < g \cdot \mu_B \cdot B + 2|M_{SO}|$, and thus the manipulation of the qubit state to be quickly made.

At the end of this manipulation, for example during a phase of initialising, reading or resting for the qubit, the value of the potential applied to the rear gate 120 can be modified in order to increase the $\Delta$ value, which causes a return to the spin qubit regime far from the resonance region in which the energy level of the state v1↑ is close to that of state v2↓, thus improving stability in the spin state. During a phase of initialising or reading the qubit, the value of the electric potential Vbg applied can be such that $\Delta(Vbg) > g \cdot \mu_B \cdot B + 10|M_{SO}|$ (or even such that $|\Delta(Vbg) - g \cdot \mu_B \cdot B| \geq 10|M_{SO}|$).

Figure 5:
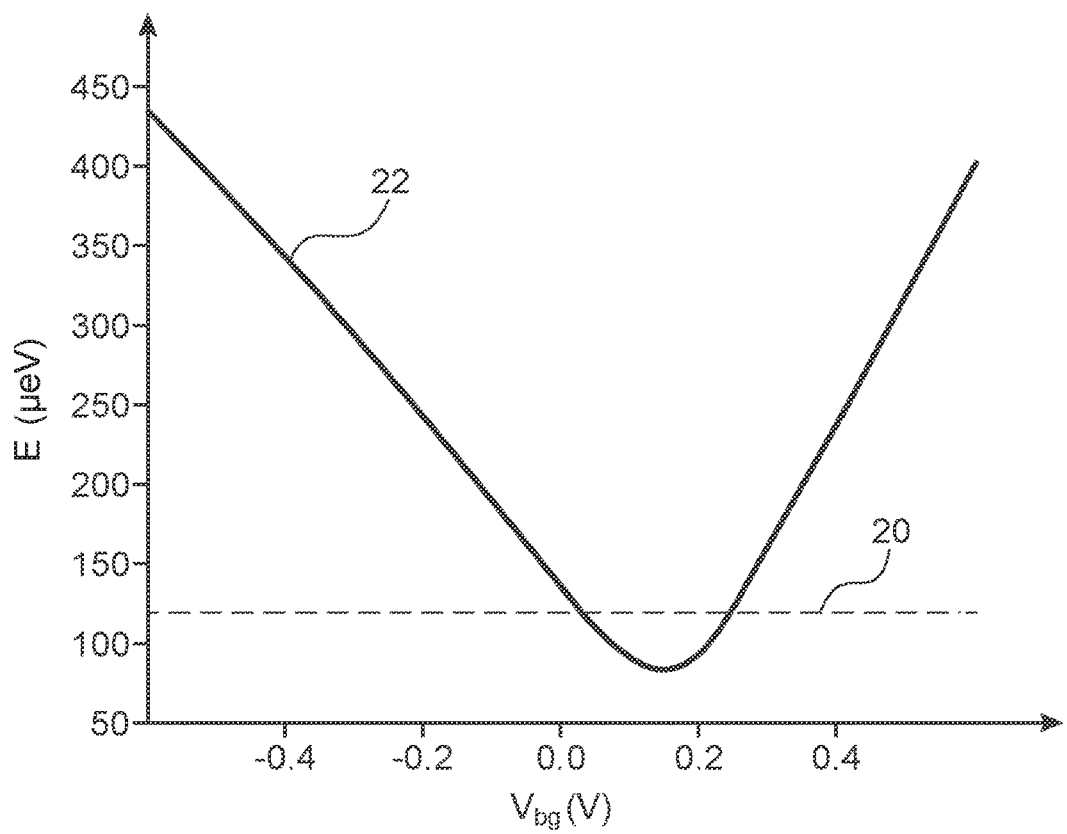
FIG. 5 shows the valley-orbit splitting value obtained by varying the value of the electric potential applied to the rear gate of the spin qubit quantum device according to the first embodiment.

FIG. 5 shows the $\Delta$ value obtained in the device 100 as a function of the value of the electric potential Vbg applied to the rear gate 120.

The value of the magnetic field B is advantageously chosen such that the value of $g \cdot \mu_B \cdot B$ is higher than min($\Delta$(Vbg))−2|$M_{SO}$|, with min($\Delta$(Vbg)) which corresponds to the minimum value of $\Delta$(Vbg) of the device 100. When the device 100 includes several qubits, this value of the magnetic field B is chosen by considering the above relationship for each of the qubits of the device 100. In the example in FIG. 5, the value of the magnetic field B is set such that the value of $g \cdot \mu_B \cdot B$, designated by the dotted line referenced 20, is higher than the minimum value of $\Delta$(Vbg) represented by the curve 22, and for example equal to about 1 T. Upon manipulating the spin state, the potential Vbg is chosen such that $\Delta(Vbg) < g \cdot \mu_B \cdot B + 2|M_{SO}|$. This corresponds, in FIG. 5, to a Vbg included between both intersections of the curve 22 with the straight line 20 which correspond to the intersections between the states v1↑ and v2↓.

Figure 6:
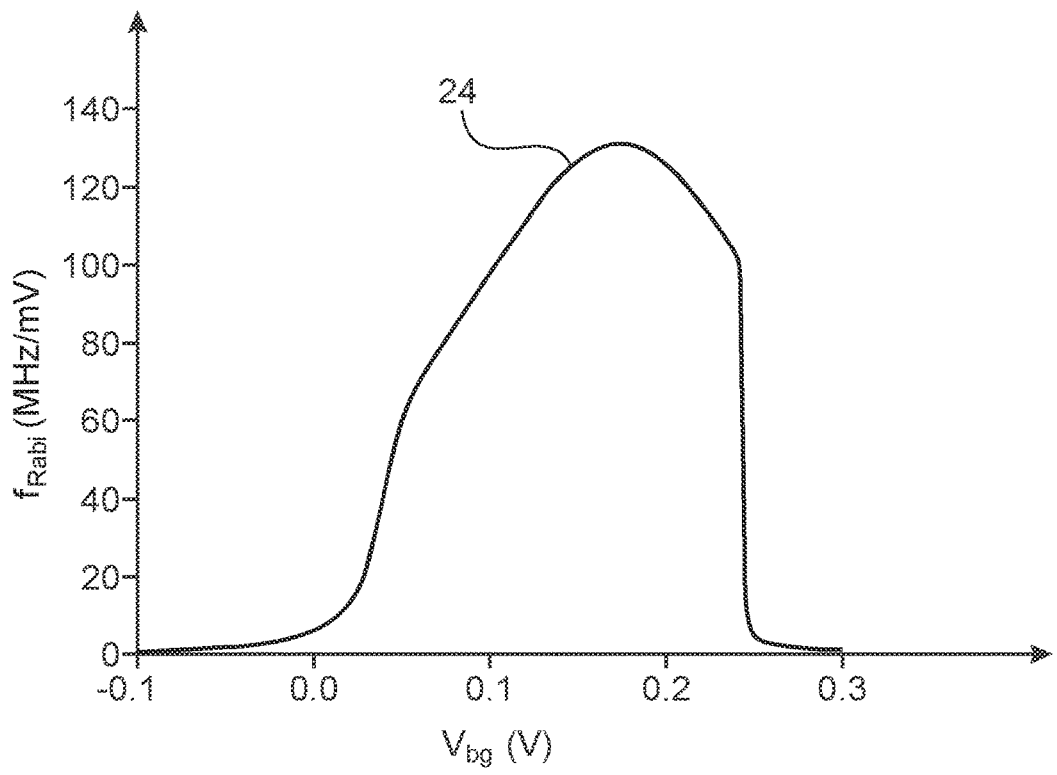
FIG. 6 shows the value of the Rabi frequency obtained by varying the value of the electric potential applied to the rear gate of the spin qubit quantum device, subject of the present invention, according to the first embodiment.

By further applying the RF signal with a proper resonant frequency to the front gate 108, a modulation in the Rabi frequency as a function of Vbg is achieved. The curve 24 shown in FIG. 6 corresponds to the Rabi frequency (spin rotational frequency) obtained along the straight line 20 shown in FIG. 5.

Figure 10:
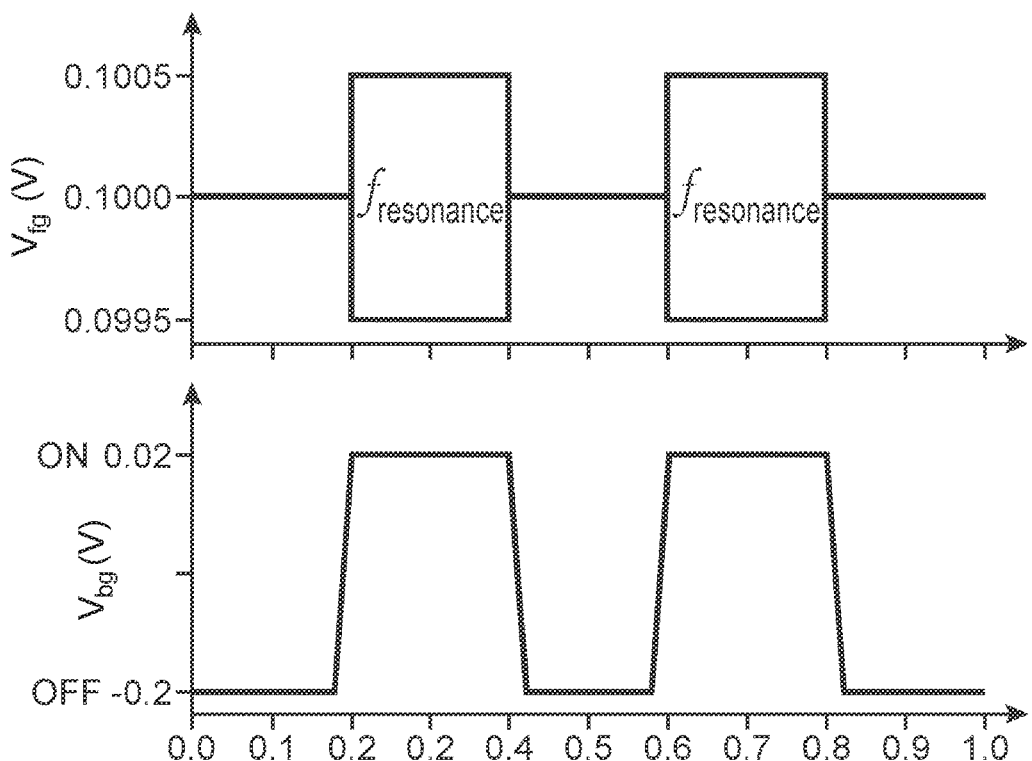
FIG. 10 shows examples of potentials applied to the front and rear gates during a method for controlling a spin qubit quantum device, subject of the present invention.

Examples of signals Vbg (electric potential applied to the rear gate 120) and Vfg (potential applied to the front gate 108) applied during the different previously described phases are shown in FIG. 10. In these examples, during the phases of initialising or reading the qubit, the potential Vfg is 0.1V and the potential Vbg is −0.2V.

During a step of manipulating the spin state, an RF signal oscillating between −0.5 mV and 0.5 mV is added to the potential Vfg, and the potential Vbg is 0.02V. The frequency f of the RF signal is equal to $\Delta E/h$, with $\Delta E$ corresponding to the deviation between the curves 10 and 12 shown in FIG. 1, that is the deviation between the energy levels v1↓ and v1↑, before the resonance 18, or between the levels v1↓ and v2↓ after this resonance (h is the Planck constant). The value of the magnetic field B is for example chosen such that $\Delta E \gg kT$, that is f>4 GHz at T=0.1 K, and such that f<50 GHz in order to operate at frequencies accessible with a quick electronics.

Generally, the potential Vfg applied can be positive and have an amplitude in the order of 0.1V, for example between 0.05V and 0.2V. The value of this potential depends in particular on the geometry of the quantum device 100, its dimensions, the material used, etc.

Apart from this phase of manipulating the spin state, for example during a phase of initialising or reading the qubit, the electric potential Vbg applied to the rear gate is such that the qubit is off resonance in order to avoid any inopportune switching between the states v1↑ and v1↓ assisted by the SOiv via the state v2↓. To that end, the electric potential Vbg can be such that $\Delta(Vbg) > g \cdot \mu_B \cdot B + 10|M_{SO}|$.

In addition, by considering several spin qubits formed within the device 100, $\Delta$ can be individually controlled for each spin qubit formed in a semiconductor portion similar to the portion 102 associated with a front gate 108 which can be independently controlled from the other gates, without having to modify the value of the magnetic field B to which all the qubits are subjected. This is very interesting because in a same magnetic field B, the energy within the different qubits varies, in particular because of the different interface roughnesses in these qubits.

In this first embodiment, the rear gate 120 is formed by an electrically conducting layer, comprising for example doped semiconductor and/or metal, disposed under the dielectric layer 104 such that the dielectric layer 104 is disposed between the rear gate 120 and the portion 102.

This rear gate 120 can be associated with one or more qubits. Thus, the rear gate 120 can be made either overall for all the qubits, for example in the form of a conducting plane disposed under all the qubits, or locally and thus be associated with a qubit or only part of the qubits.

In the first embodiment described previously, the value of the SOiv is increased thanks to the dissymmetry of the front gate 108 with respect to the plane parallel to the plane (X,Z) and passing through the middle of the nanowire 102, and thanks to the electric field generated by the potential applied to the rear gate 120. Generally, this value of the SOiv can be increased by making the device 100 such that the front gate 108 and the portion 102 form a dissymmetric assembly with respect to a plane passing through the centre of the portion 102 and parallel to at least one of the side faces 116 of the portion 102.

In a second embodiment, the SOiv is increased thanks to a dissymmetry of the front gate 108 and/or the part of the portion 102 covered with the front gate 108 with respect to a plane parallel to the plane (Y, Z) and passing through the middle of the portion 102.

Figure 7:
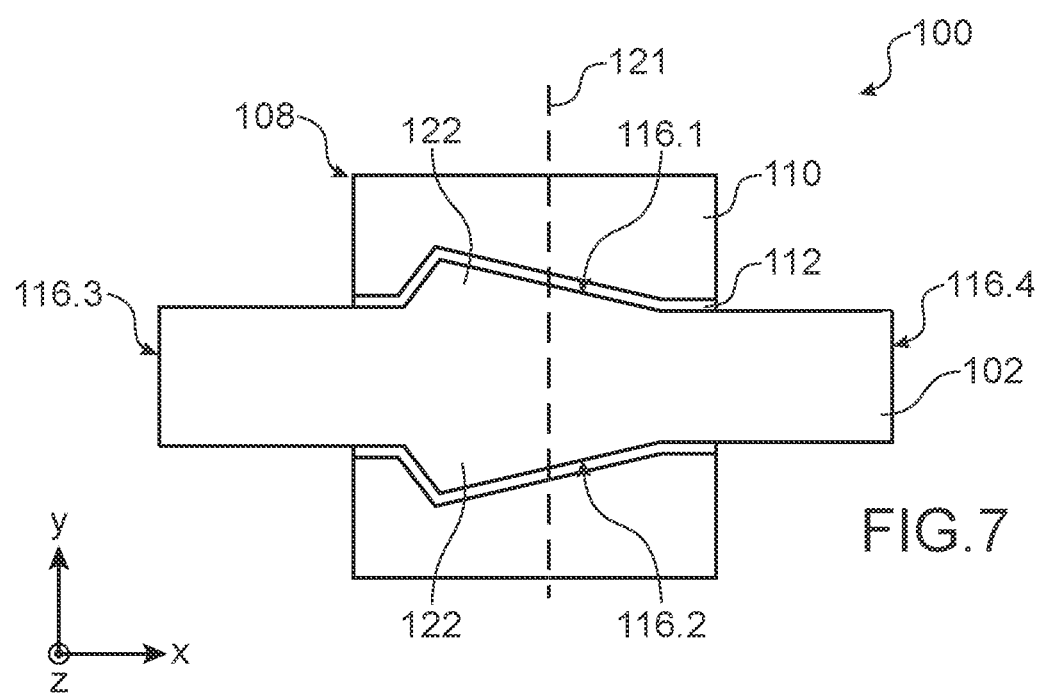
FIG. 7 is a cross-section view of the spin qubit quantum device controlled by the method according to the invention, according to a second embodiment.

FIG. 7 shows a cross-section view of the device 100 according to this second embodiment. The dotted line designated by reference 121 symbolically represents the plane with respect to which the assembly formed by the front gate 108 and the portion 102 has a dissymmetry. In this figure, the dissymmetry of the portion 102 comes from the fact that at each side of the portion 102, at the side faces 116.1 and 116.2, the portion 102 includes projecting parts 122 which are not symmetrical with respect to the plane 121.

Alternatively to the example shown in FIG. 7, it is possible that this dissymmetry with respect to the plane 121 is only formed by the front gate 108, for example by making it as a bevel such that the structure of this front gate 108 is different on either side of the plane 121. In this case, the portion 102 can be dissymmetric or not with respect to the plane 121.

Figure 8:
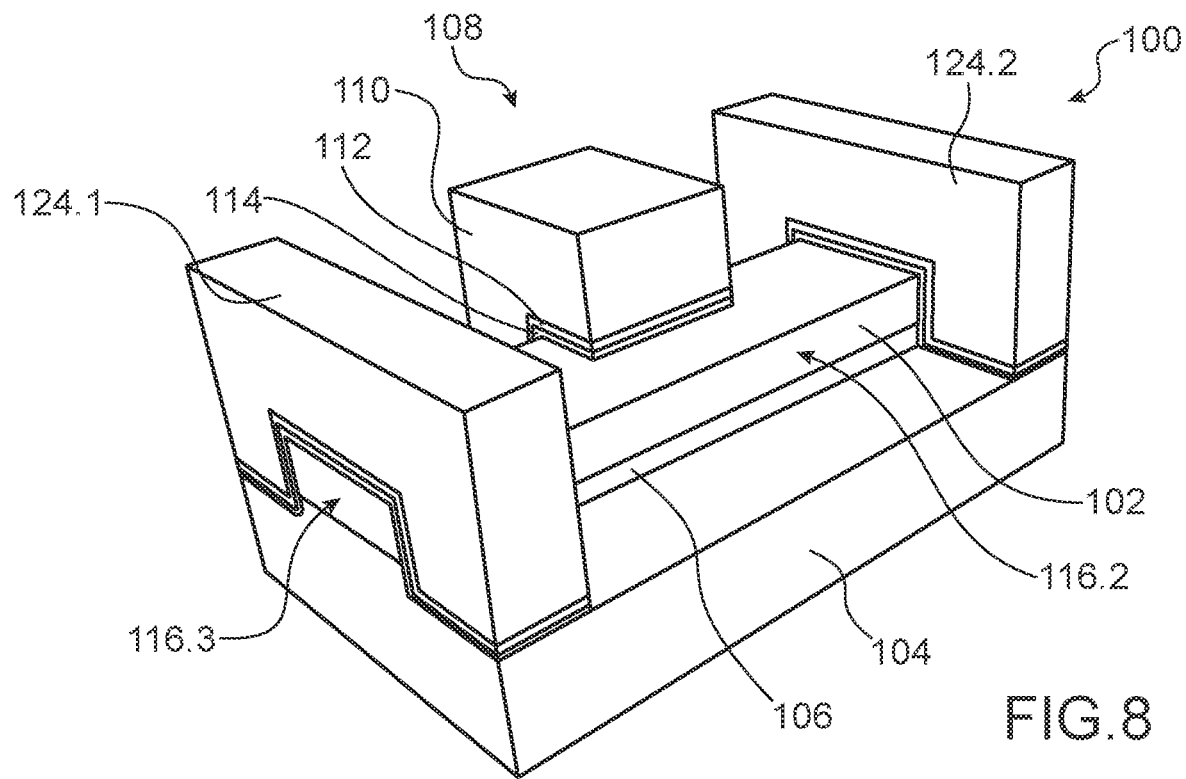
FIG. 8 corresponds to a schematic partial perspective view of a spin qubit quantum device controlled by the method according to the invention, according to a third embodiment.

FIG. 8 schematically shows the device 100 according to a third embodiment.

The device 100 includes the portion 102, the dielectric layer 104 and the front gate 108 made analogously to the first embodiment, that is such that the front gate 108 only covers a single upper ridge 113 of the portion 102.

The device 100 further includes further side gates 124.1 and 124.2 disposed around each of both ends of the portion 102, in the proximity of the side faces 116.3 and 116.4. Each of the side gates 124.1, 124.2 covers a part of each of the side faces 116.1 and 116.2 and of the upper face 115 of the portion 102. Thus, the side gates 124.1 and 124.2 cover second parts of the portion 102 located on either side of a first part of the portion 102 defining the qubit.

In the example of FIG. 8, the side gates 124.1 and 124.2 are similar with respect to each other. Alternatively, it is possible that the side gates 124.1 and 124.2 are different from each other.

These further side gates 124.1 and 124.2, disposed on either side of the quantum dot formed by the front gate 108 and the part of the portion 102 covered with the front gate 108, enable a further dissymmetry to be introduced within the qubit, thus further increasing the SOiv, via the application of different electric potentials on these side gates 124.1 and 124.2, and thus enabling to locale the wave function of the electric charge the spin state of which is manipulated in a region of the portion 102 being under the front gate 108 but not centered with respect to this front gate 108. It is for example possible to apply a first electric potential V1 to the gate 124.1 and to apply a second electric potential V2 to the gate 124.1, with V2<V1 which enables to locate this wave function in the proximity of the upper ridge 113 covered with the front gate 108, on the side of the side gate 124.1. By choosing V2>V1, the wave function is thereby located in the proximity of the upper ridge 113, but on the side of the side gate 124.2.

Figure 9:
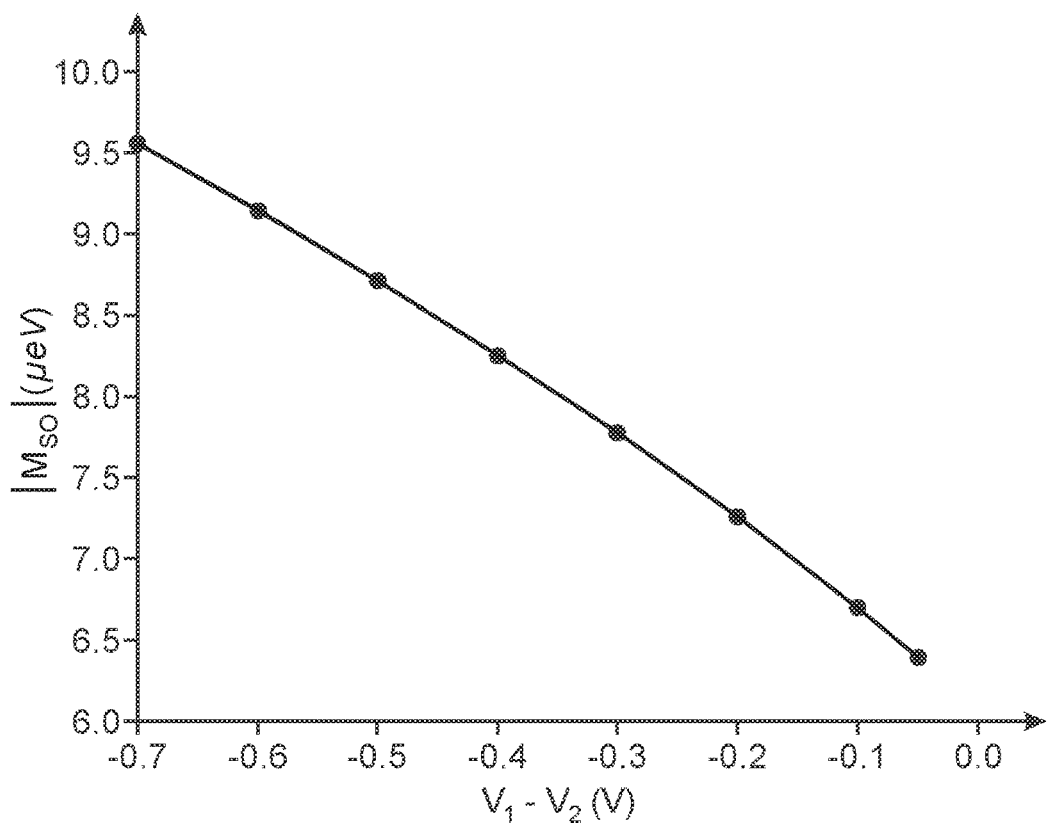
FIG. 9 shows the increase in the SOiv achieved by increasing a potential difference applied to the ends of the nanowire of the spin qubit quantum device according to the third embodiment.

FIG. 9 shows the increase in the SOiv value obtained by increasing the value of the potential difference V1-V2 applied between the side gates 124.1, 124.2.

Alternatively to the side gates 124.1, 124.2, it is possible to form, around the front gate 108, at least two electrically conducting spacers, for example of polysilicon, forming barriers providing a similar function to that of the side gates 124.1, 124.2. These electrically conducting spacers are disposed against two opposite sides of the front gate 108 and spaced from the conducting material 110 of the front gate 108 by a dielectric material interposed between the conducting material 110 and that of the conducting spacers.

Figure 11:
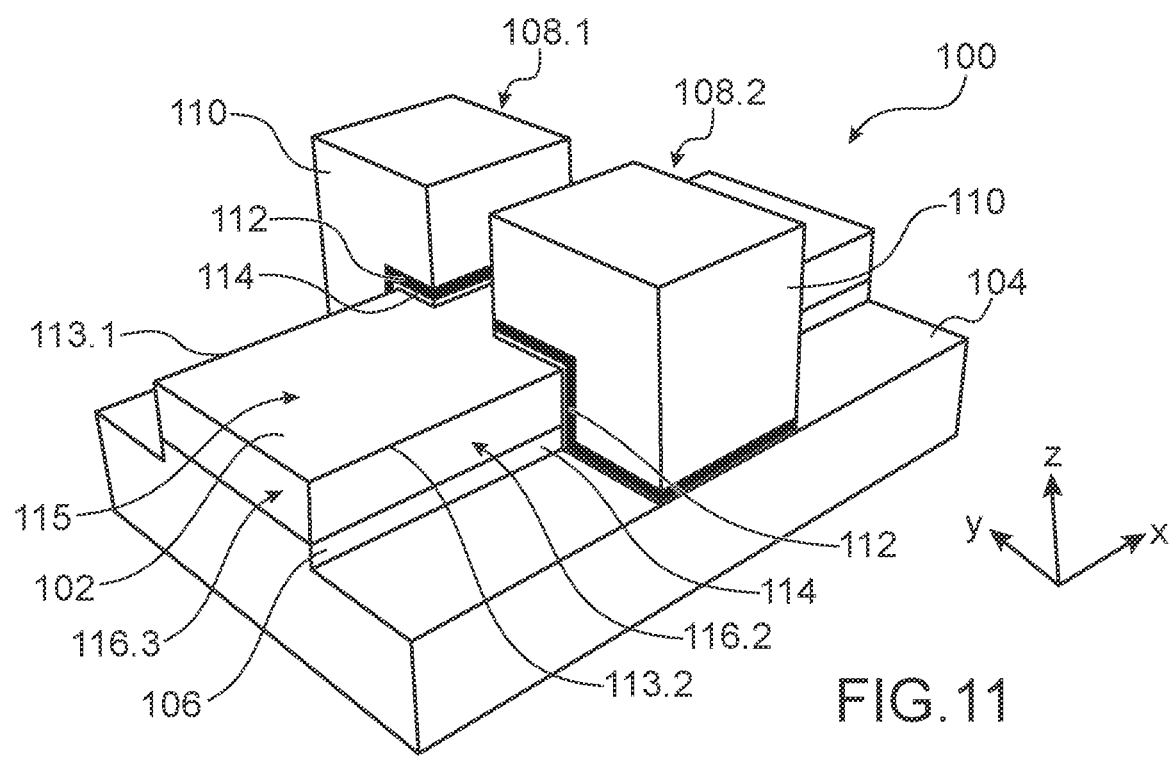
FIG. 11 shows a schematic partial perspective view of a spin qubit quantum device, subject of the present invention, according to a fourth embodiment.

FIG. 11 shows the device 100 according to a fourth embodiment.

In this fourth embodiment, the front gate 108 includes two distinct parts 108.1 and 108.2 each covering an upper ridge of the portion 102. The first part 108.1 of the front gate 108 formed in this fourth embodiment is for example similar to the front gate 108 of the device 100 according to the first embodiment and partially covers the upper ridge 113.1. The second part 108.2 of the front gate covers the upper ridge 113.2 formed at the junction of the upper face 115 and the side face 116.2, both upper ridges 113.1 and 113.2 covered with the parts 108.1 and 108.2 being substantially parallel to each other.

Figure 12:
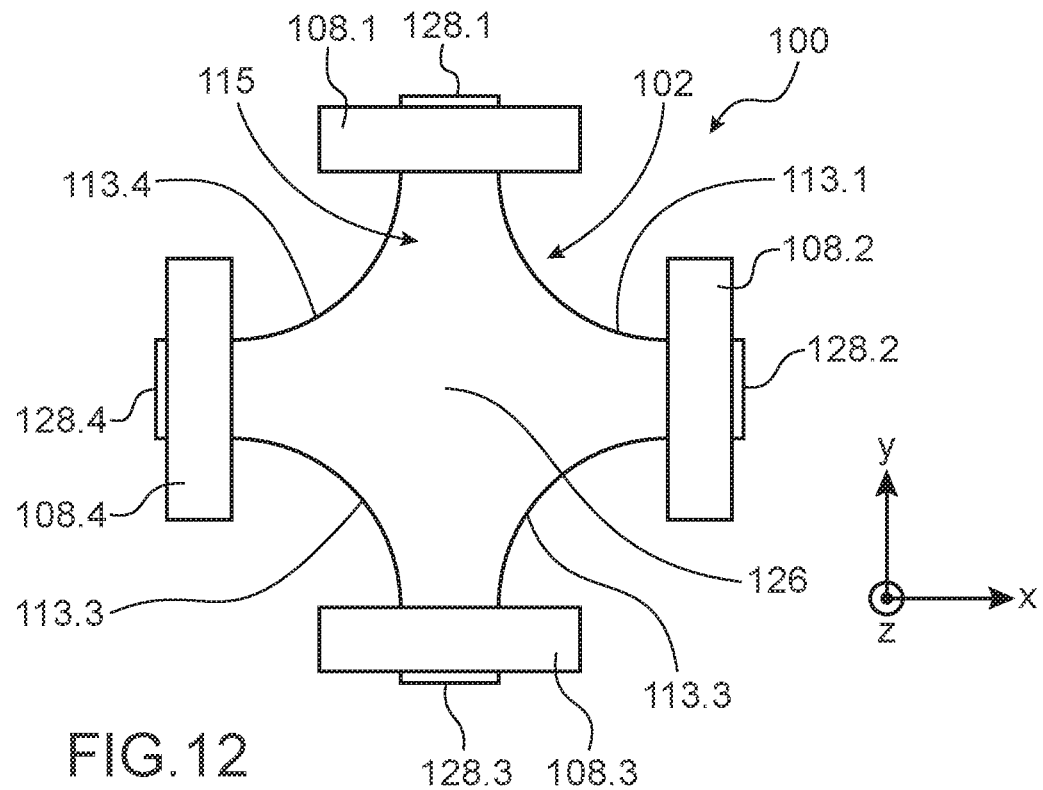
FIG. 12 shows a schematic partial perspective view of a spin qubit quantum device, subject of the present invention, according to a fifth embodiment.

FIG. 12 shows the device 100 according to a fifth embodiment.

In this fifth embodiment, the portion 102 includes a centre part 126 and four ends 128.1-128.4 connected to this centre part 126. In the example of FIG. 12, the portion 102 has, in the plane (X, Y) parallel to the upper and lower faces 115, 117 of this portion 102, a cross shape.

Each of the ends 128.1-128.4 is covered with a gate 108.1-108.4 forming together the front gate 108 of the device 100. Each of these gates 108.1-108.4 covers a part of the upper face 115 and both side faces being located at one of the ends 128.1-128.4. Thus, each of the gates 108.1-108.4 cover two of the upper side ridges of the portion 108 connecting the ends to each other. In FIG. 12, these four upper side ridges bear to references 113.1-113.4.

Upon manipulating the qubit spin state formed in the portion 102, the rear gate 120 (not visible in FIG. 12) of the device 100 is negatively polarised such that the wave function of the electric charge the spin of which is manipulated is located in the proximity of the upper face 115 of the portion 102. The electric signals thus applied to the front gates 108.1-108.4 thereby enable this wave function to be located in the proximity of one of the upper ridges 113.1-113.4. For example, to locate the wave function in the proximity of the upper ridge 113.1, the rear gate 120 is negatively polarised and the gates 108.1 and 108.2 are positively polarised in order to force this positioning of the wave function. Without these electric potentials applied to the rear gate 120 and to the front gates 108.1-108.4, the wave function is localised in the centre part 126 of the portion 102.

FIG. 12 shows the portion 102 which only forms a single qubit. When the device 100 includes several qubits, the semiconductor portion forming these qubits can correspond to the juxtaposition of several portions 102 similar to that shown in FIG. 12 and connected to each other through their ends 128.1-128.4. Each of the gates 108 formed on one of the ends can be common to two neighbouring qubits.

The invention claimed is:

1. A method for controlling a spin qubit quantum device, wherein the quantum device includes at least:
   a semiconductor portion comprising an upper face, a lower face and side faces substantially perpendicular to the upper and lower faces;
   a dielectric layer on which the semiconductor portion is disposed such that the lower face of the semiconductor portion is disposed on the side of the dielectric layer;
   a front gate partially covering at least one upper ridge of the semiconductor portion formed at a junction between the upper face and a first of the side faces;
   a rear gate such that the dielectric layer is disposed between the rear gate and the semiconductor portion;
   the method comprising, upon manipulating a spin state of the qubit of the quantum device:
   exposing the quantum device to a magnetic field B, and applying, to the rear gate, an electric potential Vbg having a value such that $\Delta(Vbg) < g \cdot \mu_B \cdot B + 2|M_{SO}|$, and applying, to the front gate, an electric potential Vfg confining at least one electric charge under the upper ridge and an electric RF signal triggering a change in spin state of the qubit of the quantum device,
   with g corresponding to the Lande factor, $\mu_B$ corresponding to the Bohr magneton, $\Delta$ corresponding to the valley-orbit splitting in the semiconductor portion, and $M_{SO}$ the inter-valley spin-orbit coupling of the quantum device.

2. The method according to claim 1, wherein the magnetic field B to which the quantum device is exposed has a value such that $g \cdot \mu_B \cdot B > \min(\Delta(Vbg)) - 2|M_{SO}|$.

3. The method according to claim 1, further including, during a phase of initialising or reading the qubit, applying the electric potential Vbg having a value such that $\Delta(Vbg) > g \cdot \mu_B \cdot B + 10|M_{SO}|$.

4. The method according to claim 1, wherein the semiconductor portion and/or the front gate are dissymmetric relative to a plane passing through the centre of the semiconductor portion and parallel to at least one second of the side faces of the semiconductor portion.

5. The method according to claim 4, wherein the first and second side faces of the semiconductor portion correspond to the same side face of the semiconductor portion.

6. The method according to claim 1, wherein the front gate covers a single upper ridge of the semiconductor portion.

7. The method according to claim 1, wherein the front gate includes two distinct parts each covering a single upper ridge of the semiconductor portion formed at a junction of the upper face and one of the side faces of the semiconductor portion, both upper ridges covered with both distinct parts of the front gate being substantially parallel to each other.

8. The method according to claim 1, wherein the quantum device further includes at least two side gates covering second parts of the semiconductor portion which are located on either side of a first part of the semiconductor portion defining the qubit, and wherein, upon manipulating the spin state of the qubit of the quantum device, electric potentials having different values from each other are applied to both side gates.

9. The method according to claim 1, wherein the quantum device further includes at least two distinct electrically conducting spacers which are disposed against two opposite sides of the front gate, and wherein, upon manipulating the spin state of the qubit of the quantum device, electric potentials having different values from each other are applied to both electrically conducting spacers.

10. The method according to claim 1, wherein the semiconductor portion includes four ends connected to a centre part and each covered at least partially with a part of the front gate which is distinct from the other parts of the front gate, and wherein, upon manipulating the spin state of the qubit of the quantum device, the RF signal is applied to two neighbouring parts of the front gate.

11. The method according to claim 1, wherein the quantum device includes several spin qubits formed in several distinct semiconductor portions, the gate being coupled with all the semiconductor portions.

12. The method according to claim 1, wherein the quantum device includes several spin qubits formed in several distinct semiconductor portions, and includes several rear gates each coupled with one of the semiconductor portions.

* * * * *